(12) United States Patent
Ayyapureddi et al.

(10) Patent No.: US 12,406,717 B2
(45) Date of Patent: Sep. 2, 2025

(54) APPARATUSES AND METHODS FOR DYNAMICALLY ALLOCATED AGGRESSOR DETECTION

(71) Applicant: MICRON TECHNOLOGY, INC., Boise, ID (US)

(72) Inventors: Sujeet Ayyapureddi, Boise, ID (US); Donald M. Morgan, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 468 days.

(21) Appl. No.: 17/932,206

(22) Filed: Sep. 14, 2022

(65) Prior Publication Data
US 2023/0010619 A1    Jan. 12, 2023

Related U.S. Application Data

(63) Continuation of application No. 17/153,555, filed on Jan. 20, 2021, now Pat. No. 11,482,275.

(51) Int. Cl.
*G11C 11/4078* (2006.01)
*G11C 11/406* (2006.01)
*G11C 11/408* (2006.01)

(52) U.S. Cl.
CPC ........ *G11C 11/4078* (2013.01); *G11C 11/406* (2013.01); *G11C 11/4085* (2013.01); *G11C 11/4087* (2013.01)

(58) Field of Classification Search
CPC .............. G11C 11/4078; G11C 11/406; G11C 11/4085; G11C 11/4087
USPC ....................................................... 365/149
See application file for complete search history.

(56) References Cited

U.S. PATENT DOCUMENTS

| | | |
|---|---|---|
| 3,633,175 A | 1/1972 | Harper |
| 4,679,173 A | 7/1987 | Sato |
| 5,089,957 A | 2/1992 | Stultz et al. |
| 5,291,198 A | 3/1994 | Dingwall et al. |
| 5,299,159 A | 3/1994 | Balistreri et al. |
| 5,422,850 A | 6/1995 | Sukegawa et al. |
| 5,617,348 A | 4/1997 | Maguire |

(Continued)

FOREIGN PATENT DOCUMENTS

| | | |
|---|---|---|
| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Connie C Yoha
(74) *Attorney, Agent, or Firm* — Dorsey & Whitney LLP

(57) ABSTRACT

Apparatuses, systems, and methods for dynamically allocated aggressor detection. A memory may include an aggressor address storage structure which tracks access patterns to row addresses and their associated bank addresses. These may be used to determine if a row and bank address received as part of an access operation are an aggressor row and bank address. The aggressor row address may be used to generate a refresh address for a bank identified by the aggressor bank address. Since the aggressor storage structure tracks both row and bank addresses, its storage space may be dynamically allocated between banks based on access patterns to those banks.

17 Claims, 5 Drawing Sheets

(56) References Cited

U.S. PATENT DOCUMENTS

| | | |
|---|---|---|
| 5,638,317 A | 6/1997 | Tran |
| 5,699,297 A | 12/1997 | Yamazaki et al. |
| 5,751,655 A | 5/1998 | Yamazaki et al. |
| 5,768,196 A | 6/1998 | Bloker et al. |
| 5,874,907 A | 2/1999 | Craft |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagal |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,418,741 B1 | 8/2016 | Ramaraju et al. |
| 9,424,907 B2 | 8/2016 | Fujishiro |
| 9,449,675 B2 | 9/2016 | Wheeler |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 | 8/2022 | Penney et al. |
| 11,462,291 B2 | 10/2022 | Pan |
| 11,482,275 B2 | 10/2022 | Ayyapureddi et al. |
| 11,521,669 B2 | 12/2022 | Enomoto et al. |
| 11,568,918 B2 | 1/2023 | Ayyapureddi et al. |
| 11,600,314 B2 | 3/2023 | Ayyapureddi et al. |
| 11,600,326 B2 | 3/2023 | Schreck et al. |
| 11,664,063 B2 | 5/2023 | Lovett |
| 11,688,451 B2 | 6/2023 | Zhang et al. |
| 11,694,738 B2 | 7/2023 | Morohashi et al. |
| 11,699,476 B2 | 7/2023 | Brown et al. |
| 11,854,618 B2 | 12/2023 | Penney |
| 11,984,148 B2 | 5/2024 | Penney et al. |
| 12,165,687 B2 | 12/2024 | He et al. |

(56) References Cited

U.S. PATENT DOCUMENTS

| | | |
|---|---|---|
| 12,217,813 B2 | 2/2025 | Pan |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0095459 A1 | 5/2003 | Derner et al. |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0039229 A1 | 2/2006 | Nakano |
| 2006/0059196 A1 | 3/2006 | Sato et al. |
| 2006/0083099 A1 | 4/2006 | Bae et al. |
| 2006/0087903 A1 | 4/2006 | Riho et al. |
| 2006/0119406 A1 | 6/2006 | Henzler et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0153611 A1 | 7/2007 | Lee |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jecideloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0260003 A1 | 10/2010 | Oh |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0085995 A1 | 3/2014 | Greenfield et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269009 A1 | 9/2014 | Ghosh et al. |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Galther et al. |
| 2015/0340077 A1 | 11/2015 | Akamatsu |

(56) References Cited

U.S. PATENT DOCUMENTS

| | | |
|---|---|---|
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0224262 A1 | 8/2016 | Mandava et al. |
| 2016/0225433 A1 | 8/2016 | Bains et al. |
| 2016/0225461 A1 | 8/2016 | Tuers et al. |
| 2016/0246525 A1 | 8/2016 | Jeffrey et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0004592 A1 | 1/2018 | Bains et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0158507 A1 | 6/2018 | Bang |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0342282 A1 | 11/2018 | Morgan |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0172521 A1 | 6/2019 | Morgan |
| 2019/0187745 A1 | 6/2019 | Murali et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237131 A1 | 8/2019 | Ito |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2020/0411095 A1 | 12/2020 | Kim |
| 2021/0005229 A1 | 1/2021 | Hiscock et al. |
| 2021/0005240 A1* | 1/2021 | Brown .................. G11C 11/408 |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |

(56) References Cited

U.S. PATENT DOCUMENTS

| | | |
|---|---|---|
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0068348 A1 | 3/2022 | Bennett et al. |
| 2022/0069992 A1 | 3/2022 | Ayyapureddi |
| 2022/0165347 A1 | 5/2022 | Pan |
| 2022/0230672 A1 | 7/2022 | Ayyapureddi et al. |
| 2022/0293166 A1 | 9/2022 | Ayyapureddi et al. |
| 2022/0415427 A1 | 12/2022 | Pan |
| 2023/0047007 A1 | 2/2023 | Lovett |
| 2023/0170008 A1 | 6/2023 | Zhang et al. |
| 2023/0205428 A1 | 6/2023 | Kim et al. |
| 2023/0206980 A1 | 6/2023 | He et al. |
| 2023/0206989 A1 | 6/2023 | He et al. |
| 2024/0038292 A1 | 2/2024 | Kim et al. |
| 2024/0069757 A1 | 2/2024 | Ko et al. |
| 2024/0135980 A1 | 4/2024 | Lee et al. |
| 2024/0144988 A1 | 5/2024 | Seo et al. |
| 2024/0212738 A1 | 6/2024 | Akamatsu et al. |
| 2024/0427497 A1 | 12/2024 | Lu |
| 2025/0068345 A1 | 2/2025 | Lu et al. |
| 2025/0124963 A1 | 4/2025 | Lu |
| 2025/0124964 A1 | 4/2025 | Lu et al. |
| 2025/0131972 A1 | 4/2025 | Pan |

FOREIGN PATENT DOCUMENTS

| | | |
|---|---|---|
| CN | 1371100 A | 9/2002 |
| CN | 101038785 A | 9/2007 |
| CN | 101067972 A | 11/2007 |
| CN | 101331554 A | 12/2008 |
| CN | 101346775 A | 1/2009 |
| CN | 101458658 A | 6/2009 |
| CN | 101595528 A | 12/2009 |
| CN | 101622607 A | 1/2010 |
| CN | 102074268 A | 5/2011 |
| CN | 102113058 A | 6/2011 |
| CN | 102364991 A | 2/2012 |
| CN | 102483952 A | 5/2012 |
| CN | 103366808 A | 10/2013 |
| CN | 103544987 A | 1/2014 |
| CN | 103928048 A | 7/2014 |
| CN | 104350546 A | 2/2015 |
| CN | 105493188 A | 4/2016 |
| CN | 105814636 A | 7/2016 |
| CN | 106710621 A | 5/2017 |
| CN | 107256717 A | 10/2017 |
| CN | 107871516 A | 4/2018 |
| CN | 108122581 A | 6/2018 |
| CN | 108154895 A | 6/2018 |
| CN | 109074305 A | 12/2018 |
| CN | 109285576 A | 1/2019 |
| CN | 109408898 A | 3/2019 |
| CN | 109074305 B | 7/2023 |
| JP | H0773682 A | 3/1995 |
| JP | H10241385 A | 9/1998 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 20180064940 A | 6/2018 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2018217582 A2 | 11/2018 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |
| WO | 2022108808 A1 | 5/2022 |

OTHER PUBLICATIONS

[English Abstract] Zheng, Bin , et al., "Design of Built-in DRAM for TFT-LCD Driver Chip"LCD and display, Issue 4, Aug. 15, 2009; pp. all.

International Application No. PCT/US20/23689, titled "Semiconductor Device Having Cam That Stores Address Signals", dated Mar. 19, 2020, pp. all pages of application as filed.

U.S. Appl. No. 15/884,192 entitled 'Semiconductor Device Performing Row Hammer Refresh Operation' filed on Jan. 30, 2018, pp. all pages of application as filed.

U.S. Appl. No. 16/797,658, titles "Apparatuses and Methods for Controlling Refresh Operations", filed Feb. 21, 2020, pp. all pages of application as filed.

U.S. Appl. No. 16/818,981 titled "Apparatuses and Methods for Staggered Timing of Targeted Refresh Operations" filed Mar. 13, 2020, pp. all pages of application as filed.

U.S. Appl. No. 16/824,460, titled "Semiconductor Device Performing Row Hammer Refresh Operation", dated Mar. 19, 2020, pp. all pages of application as filed.

U.S. Appl. No. 16/025,844, titled "Apparatus and Methods for Triggering Row Hammer Address Sampling", filed Jul. 2, 2018, pp. all pages of application as filed.

U.S. Appl. No. 16/783,063, titled "Apparatus and Methods for Triggering Row Hammer Address Sampling", dated Feb. 5, 2020, pp. all pages of application as filed.

U.S. Appl. No. 16/805,197, titled "Apparatuses and Methods for Calculating Row Hammer Refresh Addresses in a Semiconductor Device", dated Feb. 28, 2020, pp. all pages of application as filed.

U.S. Appl. No. 16/232,837, titled "Apparatuses and Methods for Distributed Targeted Refresh Operations", filed Dec. 26, 2018, pp. all pages of application as filed.

U.S. Appl. No. 16/818,989, titled "Semiconductor Device Performing Row Hammer Refresh Operation", dated Mar. 13, 2020, pp. all pages of application as filed.

U.S. Appl. No. 16/268,818, titled "Apparatuses and Methods for Managing Row Access Counts", filed Feb. 6, 2019, pp. all pages of application as filed.

U.S. Appl. No. 16/286,187 titled "Apparatuses and Methods for Memory Mat Refresh Sequencing" filed Feb. 26, 2019, pp. all pages of application as filed.

U.S. Appl. No. 16/084,119, titled "Apparatuses and Methods for Pure-Time, Self Adopt Sampling for Row Hammer Refresh Sampling", filed Sep. 11, 2018, pp. all pages of application as filed.

U.S. Appl. No. 16/886,284 titled "Apparatuses and Methods for Access Based Refresh Timing" filed May 28, 2020, pp. all pages of application as filed.

U.S. Appl. No. 16/886,284, titled "Apparatuses and Methods for Access Based Refresh Timing", dated May 28, 2020, pp. all pages of application as filed.

U.S. Appl. No. 16/358,587, titled "Semiconductor Device Having Cam That Stores Address Signals", dated Mar. 19, 2019, pp. all pages of application as filed.

U.S. Appl. No. 16/375,716 titled "Apparatuses and Methods for Staggered Timing of Targeted Refresh Operations" filed Apr. 4, 2019, pp. all pages of application as filed.

U.S. Appl. No. 16/936,297 titled "Apparatuses and Methods for Managing Row Access Counts" filed Jul. 22, 2020, pp. all pages of application as filed.

U.S. Appl. No. 16/411,573 titled "Apparatuses, Systems, and Methods for a Content Addressable Memory Cell" filed May 14, 2019, pp. all pages of application as filed.

U.S. Appl. No. 16/428,625 titled "Apparatuses and Methods for Tracking Victim Rows" filed May 31, 2019, pp. all pages of application as filed.

(56) References Cited

OTHER PUBLICATIONS

U.S. Appl. No. 16/513,400 titled "Apparatuses and Methods for Tracking Row Accesses" filed Jul. 16, 2019, pp. all pages of application as filed.
U.S. Appl. No. 17/060,403 titled "Apparatuses and Methods for Adjusting Victim Data" filed Oct. 1, 2020, pp. all pages of application as filed.
U.S. Appl. No. 16/548,027 titled "Apparatuses, Systems, and Methods for Analog Row Access Rate Determination" filed Aug. 22, 2019, pp. all pages of application as filed.
U.S. Appl. No. 16/549,942 titled "Apparatuses and Methods for Lossy Row Access Counting" filed Aug. 23, 2019, pp. all pages of application as filed.
U.S. Appl. No. 16/546,152 titled "Apparatuses and Methods for Analog Row Access Tracking" filed Aug. 20, 2019, pp. all pages of application as filed.
U.S. Appl. No. 16/549,411 titled "Apparatuses and Methods for Dynamic Refresh Allocation" filed Aug. 23, 2019, pp. all pages of application as filed.
U.S. Appl. No. 16/655,110 titled "Apparatuses and Methods for Dynamic Targeted Refresh Steals" filed Oct. 16, 2019, pp. all pages of application as filed.
U.S. Appl. No. 17/154,945 titled "Apparatuses, Systems, and Methods for a Content Addressable Memory Cell" filed Jan. 21, 2021, pp. all pages of application as filed.
U.S. Appl. No. 17/170,616 titled "Apparatuses, Systems, and Methods for Analog Row Access Rate Determination" filed Feb. 8, 2021, pp. all pages of application as filed.
U.S. Appl. No. 17/168,036 titled "Apparatuses and Methods for Analog Row Access Tracking" filed Feb. 4, 2021, pp. all pages of application as filed.
U.S. Appl. No. 17/301,533 titled "Semiconductor Device Having Cam That Stores Address Signals" filed Apr. 6, 2021, pp. all pages of application as filed.
U.S. Appl. No. 17/443,056 titled "Apparatuses and Methods for Multiple Row Hammer Refresh Address Sequences" filed Jul. 20, 2021, pp. all pages of application as filed.
U.S. Appl. No. 17/446,710 titled "Apparatuses, Systems, and Methods for Determining Extremum Numericalvalues" filed Sep. 1, 2021, pp. all pages of application as filed.
U.S. Appl. No. 17/470,883 titled "Apparatuses and Methods for Tracking Victim Rows" filed Sep. 9, 2021, pp. all pages of application as filed.
U.S. Appl. No. 17/153,555 titled "Apparatuses and Methods for Dynamically Allocated Aggressor Detection" filed Jan. 20, 2021, pp. all pages of application as filed.
International Application No. PCT/US 19/40169 titled "Apparatus and Methods for Triggering Row Hammer Address Sampling" filed Jul. 1, 2019, pp. all pages of application as filed.
International Application No. PCT/US19/64028, titled "Semiconductor Device Performing Row Hammer Refresh Operation", dated Dec. 2, 2019, pp. all pages of application as filed.
International Application No. PCT/US20/26689, titled "Apparatuses and Methods for Staggered Timing of Targeted Refresh Operations", dated Apr. 3, 2020, pp. all pages of application as filed.
International Application No. PCT/US20/40077, titled "Apparatuses and Methods for Monitoring Word Line Accesses", dated Jun. 29, 2020, pp. all pages of application as filed.
U.S. Appl. No. 17/375,817 titled "Apparatuses and Methods for Monitoring Word Line Accesses" filed Jul. 14, 2021, pp. all pages of application as filed.
U.S. Appl. No. 16/788,657, titled "Semiconductor Device Performing Row Hammer Refresh Operation", dated Feb. 12, 2020, pp. all pages of application as filed.
U.S. Appl. No. 15/881,256 entitled 'Apparatuses and Methods for Detecting a Row Hammer Attack With a Bandpass Filter' filed Jan. 26, 2018, pp. all pages of application as filed.
U.S. Appl. No. 17/822,033, titled, "Apparatuses and Methods for Tracking Word Line Accesses" filed Aug. 24, 2022, pp. all pages of application as filed.
U.S. Appl. No. 16/425,525 titled "Apparatuses And Methods For Tracking All Row Accesses" filed May 29, 2019, pp. all pages of application as filed.
U.S. Appl. No. 16/427,105 titled "Apparatuses And Methods For Priority Targeted Refresh Operations" filed May 30, 2019, pp. all pages of application as filed.
U.S. Appl. No. 16/427,140 titled "Apparatuses And Methods For Tracking Row Access Counts Between Multiple Register Stacks" filed May 30, 2019, pp. all pages of application as filed.
U.S. Appl. No. 16/437,811 titled "Apparatuses, Systems, And Methods For Determining Extremum Numerical Values" filed Jun. 11, 2019, pp. all pages of application as filed.
U.S. Appl. No. 16/537,981 titled "Apparatuses and Methods for Controlling Targeted Refresh Rates" filed Aug. 12, 2019, pp. all pages of application as filed.
U.S. Appl. No. 17/007,069 titled "Apparatuses and Methods for Providing Refresh Addresses" filed Aug. 31, 2020, pp. all pages of application as filed.
U.S. Appl. No. 17/201,941 titled "Apparatuses and Methods for Sketch Circuits for Refresh Binning" filed Mar. 15, 2021, pp. all pages of application as filed.
U.S. Appl. No. 17/444,925 titled "Apparatuses and Methods for Countering Memory Attacks" filed Aug. 12, 2021, pp. all pages of application as filed.
U.S. Appl. No. 17/456,849 titled "Apparatuses, Systems, and Methods for Main Sketch and Slim Sketch Circuitfor Row Address Tracking" filed Nov. 29, 2021, pp. all pages of application as filed.
U.S. Appl. No. 17/565,119 titled "Apparatuses and Methods for Row Hammer Counter Mat" filed Dec. 29, 2021, pp. all pages of application as filed.
U.S. Appl. No. 17/565,187 titled "Apparatuses and Methods for Row Hammer Counter Mat" filed Dec. 29, 2021, pp. all pages of application as filed.
U.S. Appl. No. 15/789,897, entitled "Apparatus and Methods for Refreshing Memory", filed Oct. 20, 2017, pp. all pages of application as filed.
U.S. Appl. No. 15/796,340, entitled: "Apparatus and Methods for Refreshing Memory" filed Oct. 27, 2017, pp. all pages of application as filed.
U.S. Appl. No. 16/012,679, titled "Apparatuses and Methods for Multiple Row Hammer Refresh Address Sequences", filed Jun. 19, 2018, pp. all pages of application as filed.
U.S. Appl. No. 16/020,863, titled "Semiconductor Device", filed Jun. 27, 2018, pp. all pages of application as filed.
U.S. Appl. No. 16/112,471 titled "Apparatuses and Methods for Controlling Refresh Operations" filed Aug. 24, 2018, pp. all pages of application as filed.
U.S. Appl. No. 16/160,801, titled "Apparatuses and Methods for Selective Row Refreshes" filed Oct. 15, 2018, pp. all pages of application as filed.
U.S. Appl. No. 16/176,932, titled "Apparatuses and Methods for Access Based Refresh Timing", filed Oct. 31, 2018, pp. all pages of application as filed.
U.S. Appl. No. 16/208,217, titled "Semiconductor Device Performing Row Hammer Refresh Operation", filed Dec. 3, 2018, pp. all pages of application as filed.
U.S. Appl. No. 16/230,300, titled "Apparatuses and Methods for Staggered Timing of Targeted Refresh Operations" filed Dec. 21, 2018, pp. all pages of application as filed.
U.S. Appl. No. 16/231,327 titled "Apparatuses and Methods for Selective Row Refreshes", filed Dec. 21, 2018, pp. all pages of application as filed.
U.S. Appl. No. 16/237,291, titled "Apparatus and Methods for Refreshing Memory", filed Dec. 31, 2018, pp. all pages of application as filed.
U.S. Appl. No. 16/290,730, titled "Semiconductor Device Performing Row Hammer Refresh Operation", filed Mar. 1, 2019, pp. all pages of application as filed.
U.S. Appl. No. 16/374,623, titled "Semiconductor Device Performing Row Hammer Refresh Operation", filed Apr. 3, 2019, pp. all pages of application as filed.
U.S. Appl. No. 16/411,698 title "Semiconductor Device" filed May 14, 2019, pp. all pages of application as filed.

(56) References Cited

OTHER PUBLICATIONS

U.S. Appl. No. 16/427,330 titled "Apparatuses and Methods for Storing Victim Row Data" filed May 30, 2019, pp. all pages of application as filed.

U.S. Appl. No. 16/431,641 titled "Apparatuses and Methods for Controlling Steal Rates" filed Jun. 4, 2019, pp. all pages of application as filed.

U.S. Appl. No. 16/682,606, titled "Apparatuses And Methods For Distributing Row Hammer Refresh Events Across A Memory Device", filed Nov. 13, 2019, pp. all pages of application as filed.

U.S. Appl. No. 17/102,266, titled "Apparatuses and Methods for Tracking Word Line Accesses", dated Nov. 23, 2020, pp. all pages of application as filed.

U.S. Appl. No. 15/876,566 entitled 'Apparatuses and Methods for Calculating Row Hammer Refresh Addresses in a Semiconductor Device' filed Jan. 22, 2018, pp. all pages of application as filed.

International Application No. PCT/US20/32684, titled "Apparatuses, Systems, and Methods for a Content Addressable Memory Cell", dated May 13, 2020, pp. all pages of application as filed.

U.S. Appl. No. 15/656,084, titled "Apparatuses And Methods For Targeted Refreshing Of Memory", filed Jul. 21, 2017, pp. all pages of application as filed.

U.S. Appl. No. 16/459,520 titled "Apparatuses and Methods for Monitoring Word Line Accesses", filed Jul. 1, 2019, pp. all pages of application as filed.

International Application No. PCT/US18/55821 "Apparatus and Methods for Refreshing Memory" filed Oct. 15, 2018, pp. all pages of application as filed.

U.S. Appl. No. 15/715,846, entitled "Semiconductor Device", filed Sep. 26, 2017, pp. all pages of application as filed.

U.S. Appl. No. 15/888,993, entitled "Apparatuses and Methods for Controlling Refresh Operations", filed Feb. 5, 2018, pp. all pages of application as filed.

U.S. Appl. No. 16/190,627 titled "Apparatuses and Methods for Targeted Refreshing of Memory" filed Nov. 14, 2018, pp. all pages of application as filed.

U.S. Appl. No. 16/459,507 titled "Apparatuses and Methods for Adjusting Victim Data", filed Jul. 1, 2019, pp. all pages of application as filed.

U.S. Appl. No. 15/281,818, entitled: "Semiconductor Device" filed Sep. 30, 2016, pp. all pages of application as filed.

Kim, et al., "Flipping Bits in MemoryWithout Accessing Them: An Experimental Study of DRAM Disturbance Errors", IEEE, Jun. 2014, 12 pgs.

Stout, Thomas et al., "Voltage Source Based Voltage-to-Time Converter", IEEE, downloaded Jul. 2020, p. All.

U.S. Appl. No. 18/741,485 titled "Apparatuses and Methods for Aggressor Queue Based Mitigation Threshold" filed Jun. 12, 2024, pp. all pages of the application as filed.

U.S. Appl. No. 18/743,783 titled "Apparatuses and Methods for Per-Row Count Based Refresh Target Identification" filed Jun. 14, 2024, pp. all pages of the application as filed.

U.S. Appl. No. 18/744,988 titled "Apparatuses and Methods for Per-Row Count Based Refresh Target Identification With Sorting" filed Jun. 17, 2024, pp. all pages of the application as filed.

U.S. Appl. No. 18/745,068 titled "Apparatuses and Methods for Per Row Activation Counter Testing" filed Jun. 17, 2024, pp. all pages of the application as filed.

\* cited by examiner

APPARATUSES AND METHODS FOR DYNAMICALLY ALLOCATED AGGRESSOR DETECTION

CROSS REFERENCE TO RELATED APPLICATION(S)

This application is a continuation of U.S. patent application Ser. No. 17/153,555 filed Jan. 20, 2021 and issued as U.S. Pat. No. 11,482,275 on Oct. 25, 2022. The aforementioned application, and issued patent, is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Various access patterns to a particular memory cell or group of memory cells (often referred to as an attack) may cause an increased rate of data degradation in nearby memory cells. Memory cells affected by the attack may be identified and refreshed as part of a targeted refresh operation. The memory may track access patterns to various memory addresses in order to determine if they involved in an attack. However, it may be extremely storage intensive to track accesses to every address.

DETAILED DESCRIPTION

Figure 1:
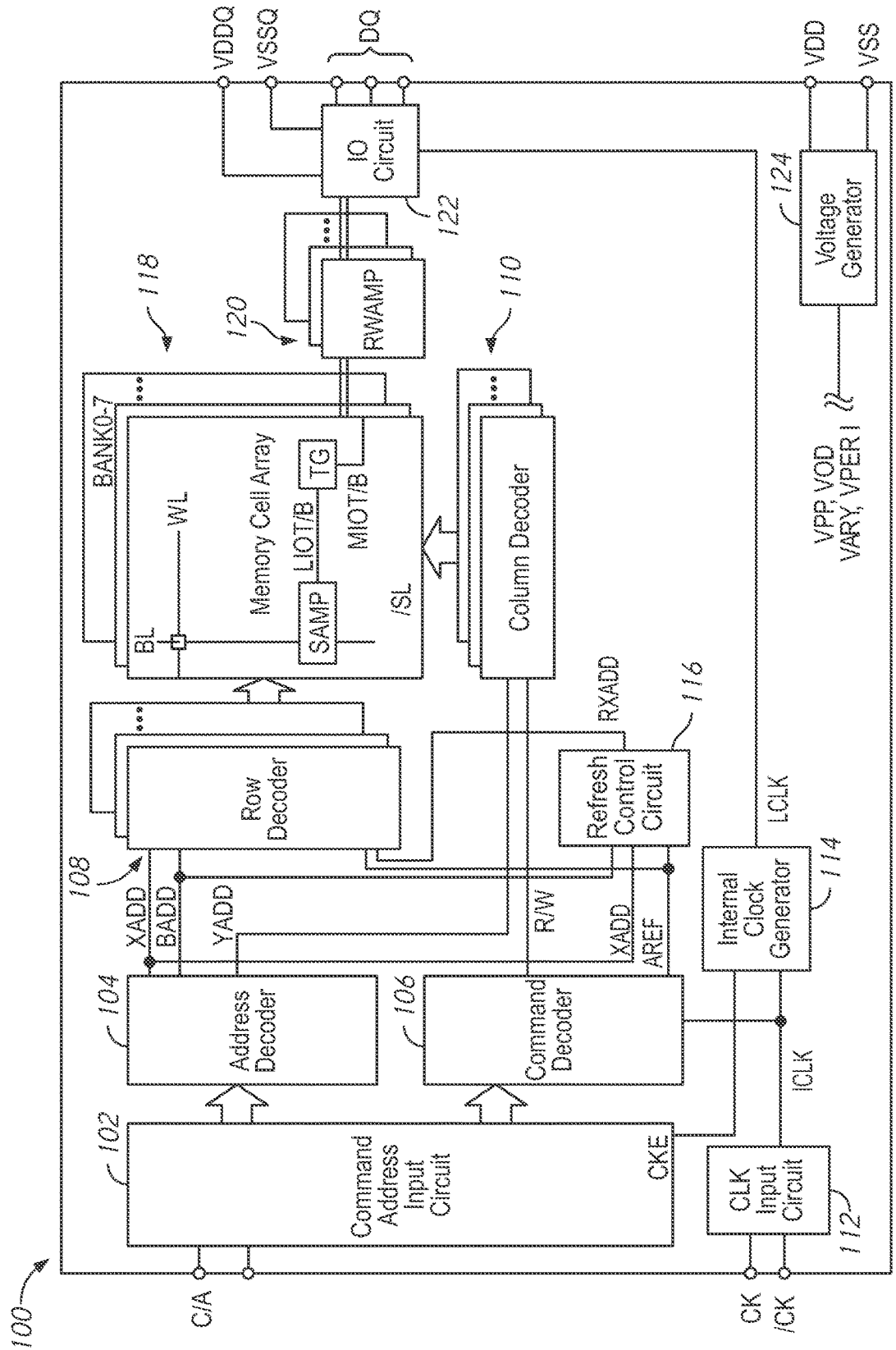
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out a background refresh process, such as auto-refresh operations as part of a self-refresh mode. During a refresh operation, information may be rewritten to the wordline to restore its initial state. The auto-refresh operations may be performed on the wordlines of the memory in a sequence such that over time the wordlines of the memory are refreshed at a rate faster than the expected rate of data degradation.

Various attack patterns, such as repeated access to a particular row of memory (e.g., an aggressor row) may cause an increased rate of decay in neighboring rows (e.g., victim rows) due, for example, to electromagnetic coupling between the rows. The pattern of repeated accesses may be referred to as a 'row hammer'. These repeated accesses may be part of a deliberate attack against the memory and/or may be due to 'natural' access patterns of the memory. The increased rate of decay in the victim rows may require that they be refreshed as part of a targeted refresh operation to prevent information from being lost.

The memory may track accesses to different rows to determine if those rows are aggressors or not. An aggressor detector circuit may store row potential aggressor addresses (e.g., row addresses which were previously accessed) and may compare those stored row addresses to a currently accessed row address. The ability of the memory to accurately catch aggressor addresses may depend, in part on how the memory stores potential aggressor addresses. Some solutions may include a storage structure for storing potential aggressor addresses for each bank of the memory. However, this solution may not scale well as the number of banks increases. Further, it may be inefficient to divide the storage on a bank-by-bank basis, as it is unlikely that every bank will be attacked at the same time. There may thus be a need to increase the efficiency of aggressor address storage and tracking.

The present disclosure is drawn to apparatuses, systems, and methods for dynamically allocated aggressor detection. A memory device may have an aggressor address storage structure which is shared between one or more banks of the memory. The individual storage slots of the storage structure may be dynamically allocated between different banks (e.g., based on the accesses to those banks). For example, the storage structure may store row addresses along with their associated bank addresses. The aggressors may be determined based on both the stored row and bank addresses. Once an aggressor is detected, its victims may be located and refreshed based on both the row and bank address. Since the slots in the storage structure are not permanently assigned to a given bank, the space may be dynamically allocated to different banks based on the access patterns to those banks. In this manner, if a single bank is attacked, more storage may be available for tracking that attack, even though the aggressor address storage may include fewer total storage spaces than may be used in bank specific solutions. In some embodiments, the shared aggressor address storage may also move to an area of the memory die which is more distant from the banks (e.g., not in the bank logic region) which may help reduce free up space closer to the banks. In some embodiments, the sharing of aggressor storage may also allow for a reduction in the total amount of aggressor storage on the memory device compared to memory devices which have a separate aggressor storage for each bank.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 110 and to an internal dock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD (and in some embodiments, one more additional signals indicating the type of operation), the row decoder 108 may perform a targeted refresh or auto-refresh operation. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similarly, victim addresses may be determined based on which wordlines are expected to be effected by aggressors, rather than a definitive determination of which wordlines are undergoing an increased rate of data decay.

As described in more detail herein, the refresh control circuit 116 may be divided between components where are specific to a given bank and components which are shared between banks. The aggressor detector portion of the refresh control circuit 116 may be common between one or more banks, while portions of the refresh control circuit 116 which generate the refresh address RXADD may be bank specific. Accordingly, there may be a single aggressor detector portion, while there may be multiple refresh address generator portions (e.g., one for every bank). In some embodiments, these components may be placed in different parts of the physical die which holds the memory device. An example refresh control circuit is described in more detail in FIG. 2.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
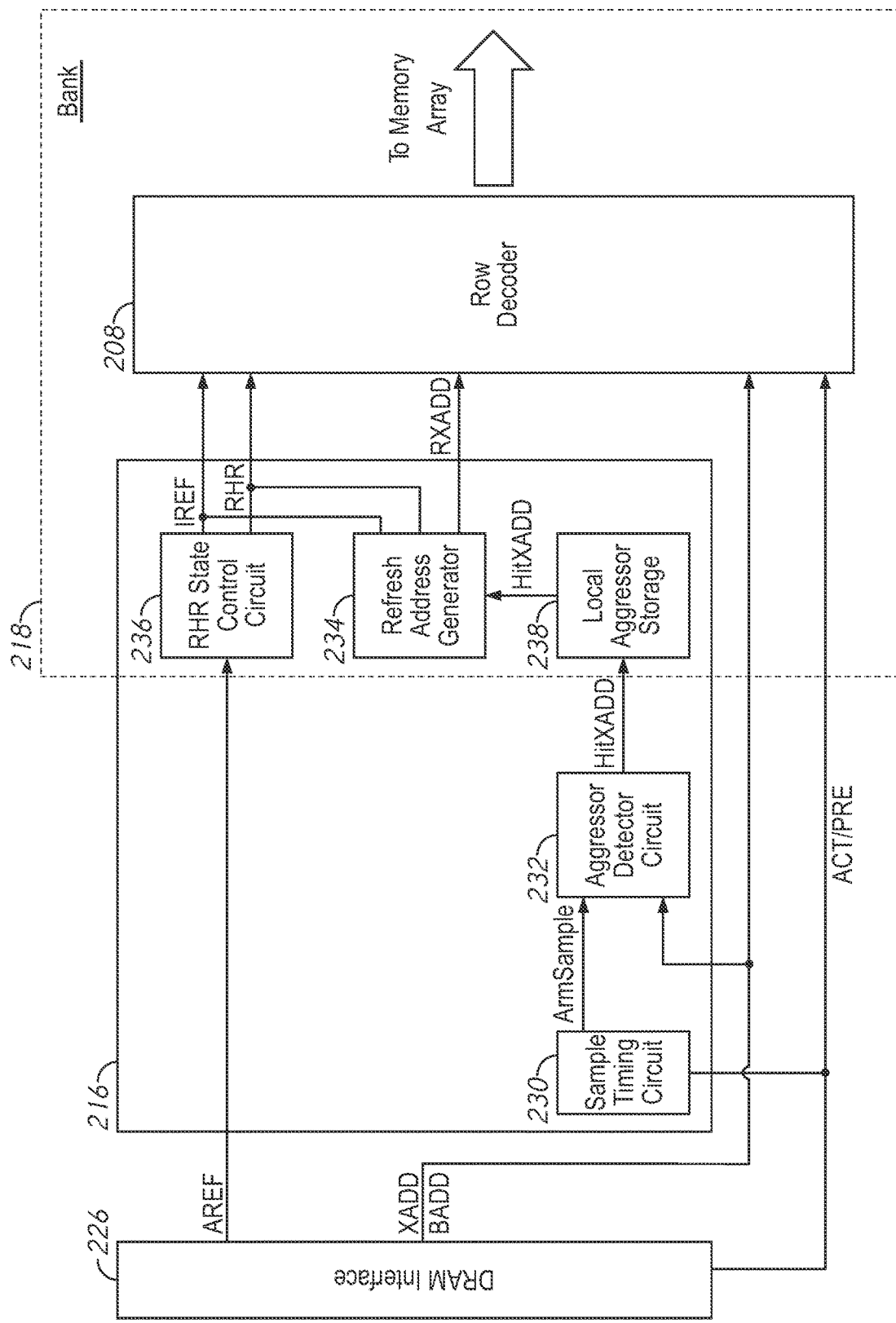
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the RHR state control circuit 236, the refresh address generator 234, the local aggressor storage 238, and the row decoder 208) may correspond to a particular bank of memory, and that these components may be repeated for each of the banks of memory. Similarly, other components, such as the sample timing circuit 230 and aggressor detector 232 may be shared amongst the banks. For the sake of brevity, since the components repeated for each bank may be generally similar to each other, only the interaction of the shared components with a single set of bank-by-bank components will be described in detail.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, and a row address XADD. The refresh control circuit 216 provides refresh address RXADD with timing based on the refresh signal AREF, wherein some of the refresh addresses are based on the received row address XADD.

In some embodiments, the aggressor detector circuit 232 may sample the current row address XADD responsive to an activation a sampling signal ArmSample. The aggressor detector circuit 232 may be coupled to the row addresses XADD and bank addresses BADD along the address bus, but may only receive (e.g., process, pay attention to) the current value of the row address XADD and bank address BADD when there is an activation of the sampling signal ArmSample. The sampled addresses may be stored in the aggressor circuit 232 and/or compared to previously stored addresses. The aggressor detector circuit 232 may provide a match address HitXADD (e.g., an identified aggressor address) based on a currently sampled row address XADD and bank address BADD and/or previously sampled row addresses and bank addresses. The aggressor address HitXADD may be a sampled/stored row address and may be directed to bank level circuits (e.g., local aggressor storage 238) based on the bank address BADD which was sampled/stored along with the sampled stored row address.

The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto-refresh should occur. Responsive to an activation of RHR or IREF, the refresh address generator 234 may provide a refresh address RXADD, which may be an auto-refresh address or may be one or more victim addresses corresponding to victim rows of the aggressor row corresponding to the match address HitXADD stored in the local aggressor storage 238 (or directly provided by the aggressor detector circuit 232). The RHR state control circuit 236 may provide a set of activations of RHR and IREF responsive to the refresh signal AREF, representing a number of refresh pumps to each activation of the refresh signal AREF. The row decoder 208 may perform a targeted refresh operation responsive to the refresh address RXADD and the row hammer refresh signal RHR. The row decoder 208 may perform an auto-refresh operation based on the refresh address RXADD and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, a bank address BADD the refresh signal AREF, and access signals such as an activation signal ACT and a pre-charge signal PRE. The refresh signal AREF may be a periodic signal which may indicate when an auto-refresh operation is to occur. The access signals ACT and PRE may generally be provided as part of an access operation along with a row address XADD and bank address BADD. The activation signal ACT may be provided to activate a bank and row of the memory associated with the associated bank and row address. The pre-charge signal PRE may be provided to pre-charge the bank and row of the memory specified by the bank and row address.

The row address XADD may be a signal including multiple bits (which may be transmitted in series or in parallel) and may correspond to a specific row of an activated memory bank. Similarly, the bank address BADD may be a multi-bit signal which corresponds to a specific bank of the memory array. The number of bits of the row and bank address may be based on a number of banks, and a number of rows in each bank. For example, the row address may be 17 bits long, while the bank address may be 5 bits long.

In the example embodiment of FIG. 2, the refresh control circuit 216 uses sampling to monitor a portion of the addresses XADD and BADD provided along the address bus. Accordingly, instead of responding to every address, the refresh control circuit 216 may sample the current value of the address XADD and BADD on the address bus, and may determine which addresses are aggressors based on the sampled addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with periodic timing, random timing, semi-random timing, pseudo-random timing, or combinations thereof. In other embodiments, sampling may not be used, and the aggressor detector circuit 232 may receive every value of the row address XADD and bank address BADD along the row address bus.

As described in more detail herein, the aggressor detector circuit 232 may determine aggressor addresses based on one or more of the sampled row and bank addresses, and then may provide the determined aggressor address as the match address HitXADD. Although based on a row and bank address pair, in some embodiments, the match address HitXADD may represent just an identified aggressor row address, while the bank address may be used to route that match address HitXADD to the proper bank portion 218. The aggressor detector circuit 232 may include a data storage unit (e.g., a number of registers), which may be used to store sampled row and bank addresses. When the aggressor detector circuit 232 samples a new value of the row address XADD and bank address BADD (e.g., responsive to an activation of ArmSample) it may compare the sampled row and bank address to the row/bank addresses stored in the data storage unit. In some embodiments, the match address HitXADD may be one of the addresses stored in the aggressor detector circuit 232 which has been matched by the sampled addresses the most frequently.

The RHR state control circuit 236 may receive the refresh signal AREF and provide the auto-refresh signal IREF and the row hammer refresh signal RHR. The refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time). In some embodiments, IREF may be activated for every refresh operation, and an auto-refresh operation may be performed unless RHR is also active, in which case a targeted refresh operation is performed instead.

In some embodiments, the refresh control circuit 216 may perform multiple refresh operations responsive to each activation of the refresh signal AREF. For example, each time the refresh signal AREF is received, the refresh control circuit 216 may perform N different refresh operations, by providing N different refresh addresses RXADD. Each refresh operation may be referred to as a 'pump'. The different pumps generated in response to the refresh signal AREF may be a mix of auto-refresh and targeted refresh operations. For example, if 4 pumps are generated, two may be used for auto-refresh operations and two may be used for targeted refresh operations. Other patterns may be used in other embodiments. In some embodiments, the pattern of targeted and auto-refresh operations may vary between different groups of pumps.

The refresh address generator 234 may receive the row hammer refresh signal RHR and the match address HitXADD. The match address HitXADD may represent an aggressor row. The refresh address generator 234 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD-1). In some embodiments, the victim rows may also include rows which are physically adjacent to the physically adjacent rows of the aggressor row (e.g., HitXADD+2 and HitXADD-2). Other relationships between victim rows and the identified aggressor rows may be used in other examples. For example, +/-3, +/-4, and/or other rows may also be refreshed.

The refresh address generator 234 may determine the value of the refresh address RXADD based on the row hammer refresh signal RHR. In some embodiments, when the signal RHR is not active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/-1) more frequently than victim rows which are further away from the aggressor address (e.g., HitXADD+/-2).

In some embodiments, the match address HitXADD may be stored in an optional local aggressor storage 238. While the refresh address generator 234 may, in some embodiments, retrieve the match address HitXADD directly from the aggressor detector circuit 232. However, this may lead to timing difficulties, for example if the aggressor detector circuit 232 is located in a portion of the memory device which is not proximal to the memory bank components 218. Accordingly, when a match address HitXADD is identified, it may be stored in a local aggressor storage 238. The aggressor detector circuit 232 may provide the match address HitXADD to the appropriate local aggressor storage 238 based on the bank address associated with the match address (e.g., the bank address which was received/stored with the match address). In some embodiments, the match address HitXADD may be provided to the local aggressor storage 238 along the address bus (e.g., a row address bus). Various timing logic may be used to prevent conflicts with other addresses along the address bus. In some embodiments, the aggressor detector circuit 232 and local aggressor storage 238 may be coupled by a dedicated bus (e.g., a different bus from the address bus used to carry the row and bank addresses as part of an access operation). The dedicated bus may operate in a serial fashion, a parallel fashion, or combinations thereof.

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

Figure 3:
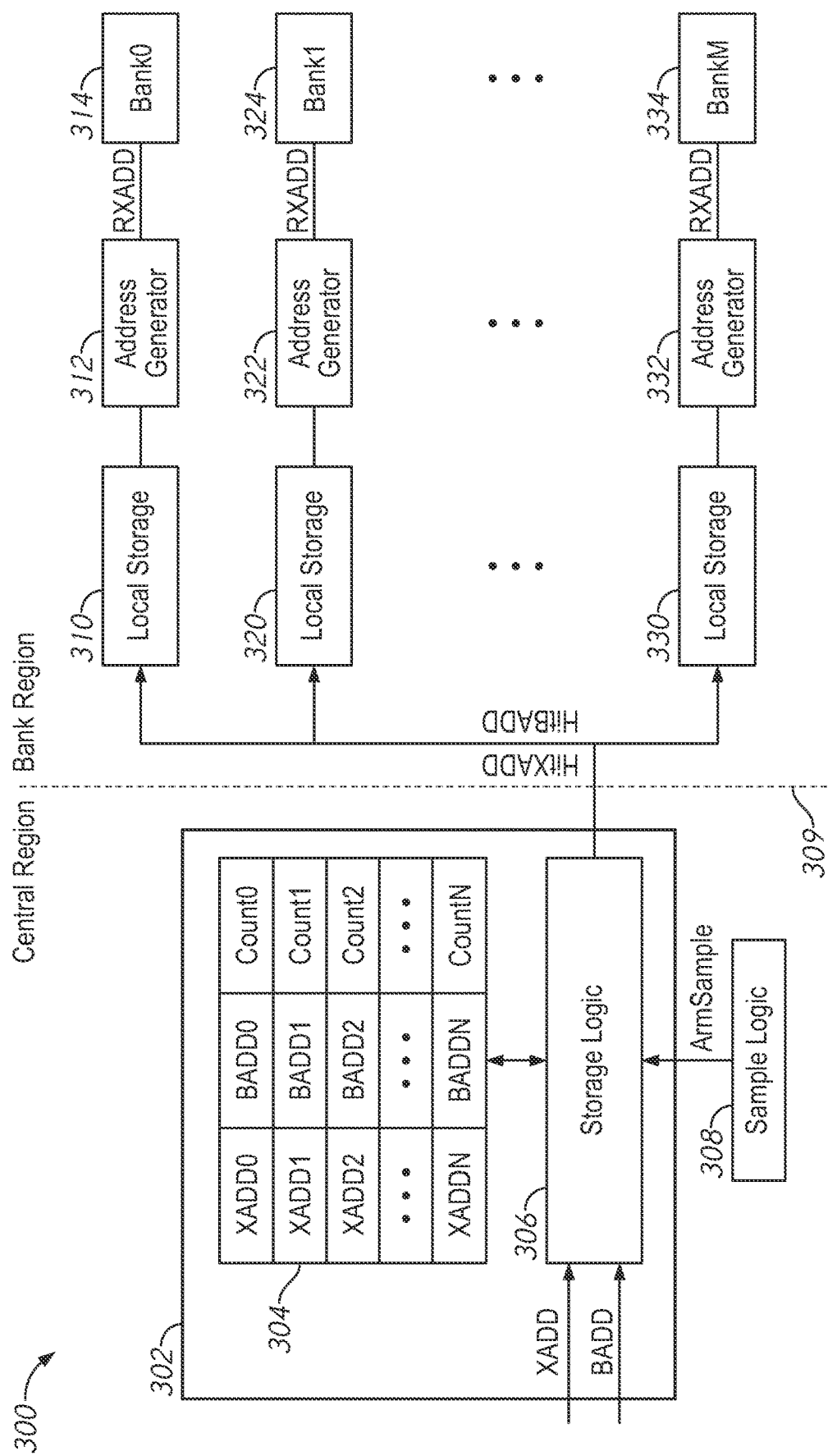
FIG. 3 is a block diagram of a portion of a memory according to some embodiments of the present disclosure.

FIG. 3 is a block diagram of a portion of a memory according to some embodiments of the present disclosure. The memory 300 may, in some embodiments, represent a portion of the memory 102 of FIG. 1. In particular, the memory 300 shows certain components useful for discussing the operation of an aggressor detector circuit 302. The aggressor detector circuit 302 may, in some embodiments, be included in the aggressor detector circuit 232 of FIG. 2.

The aggressor detector circuit 302 includes an address storage structure 304 and storage logic 306 which manages the information stored in the address storage structure 304. The address storage structure 304 has a number of individual slots (e.g., rows as illustrated in FIG. 3), each of which stores one or more associated pieces of information. For example, in FIG. 3, each slot of the address storage structure 304 holds a row address XADD, a bank address BADD, and a count value Count. As discussed in more detail herein, other embodiments may store different information and/or may store information in different ways.

The storage logic 306 may represent one or more components which manage the contents of the address storage structure 304. When the sampling signal ArmSample is provided by the sample timing logic 308, the storage logic 306 may capture the next row address XADD and bank address BADD along the address bus. The storage logic 306 may compare the received row and bank address to row and bank addresses stored in the address storage structure 304. The storage logic 306 may determine if the received row and bank address match one of the stored row and bank addresses.

In some embodiments, the address storage structure 304 may include content addressable memory (CAM) cells. Each CAM cell may store an individual bit of information. For example, if the row address is i bits long and the bank address is j bits long, then each slot may include i+j CAM cells. The CAM cells which make the address storage portion of a slot may act together to provide a match signal which indicates if all of the bits of received information (e.g., a sampled row/bank address) matches the bits of the stored information (e.g., a stored row/bank address). For example, each CAM cell may provide a cell match signal, and the cell match signals may be logically combined (e.g. with AND logic) to determine an overall match signal. In some embodiments, the match signal may only be provided if all of the bits of the sampled bank address match the stored bank address and all of the bits of the sampled row address associated with the sampled bank address match the stored row address associated with the stored bank address.

The aggressor detector 302 may use a count based scheme to determine if a sampled row and bank address are an aggressor address. Accordingly, if there is a match between the received (e.g., sampled) row and bank address and one of the stored row and bank addresses, then the count value associated with the stored row and bank address may be changed (e.g., incremented). The storage logic 306 may include one or more count logic circuits. Responsive to a match signal from the aggressor address storage 304, the count value in the slot which provided the match signal may be read out, and updated (e.g., incremented).

The updated count value may be compared to a threshold by a comparator circuit of the storage logic 306. Based on that comparison (e.g., if the updated count is greater than the threshold), the storage logic may determine if the sampled bank/row address are aggressors, and may provide the sampled row address as the match address HitXADD and the sampled bank address BADD as the match address HitBADD. If the sampled address is not a match address (e.g., if the count is below the threshold) then the updated count value may be written back to the aggressor address storage 304. If the sampled address is provided as the match address HitXADD/HitBADD, the count value may be further changed (e.g., decremented by the threshold value, reset to an initial value such as 0, etc.) before being written back to the aggressor address storage 304. In some embodiments, the stored row and bank address may be removed from the address storage structure 304 once they are used to provide the match address HitXADD and HitBADD.

If there is not a match between the received row and bank address and any of the stored row and bank addresses, the storage logic 306 may store the received row and bank address in the address storage structure 304. The storage logic 306 may determine if there is open space (e.g., a slot which is not currently in use) in the aggressor storage structure 304, and if so, store the received row and bank address in the open space. If there is not an open space, then the storage logic 306 may use one or more criterion to determine whether to and where to store the new row and bank addresses. For example, the stored row and bank address associated with a lowest of the count values may be replaced.

In some embodiments, the storage logic 306 may use different criterion for determining which address is a match address HitXADD and HitBADD. For example, the storage logic 306 may compare the received row and bank address to the stored row and bank addresses, and provide the received row and bank address as the address HitXADD and HitBADD if there is a match. In such embodiments, the aggressor storage structure 304 may not include count values. In another example, the storage logic 306 may provide the stored row and bank address which have the highest count value as the address HitXADD and HitBADD. Other schemes for identifying the aggressor address so it can be provided as the match address HitXADD and HitBADD may be used in other example embodiments.

The match row and bank address HitXADD and HitBADD respectively may be provided to the refresh circuitry specific to the bank associated with the bank match address HitBADD. The match bank address HitBADD may be used to route the match row address HitXADD to the circuitry specific to the bank associated with the bank address HitBADD.

In the embodiment of FIG. 3, three example banks, 314, 324, and 334 are shown. Each bank is associated with a respective local address storage structure and address generator, as well as other bank specific circuitry not shown in FIG. 3 (e.g., a row decoder, RHR state control circuit). Thus, for example, the first bank 314 has a bank specific local address storage 310 and address generator 312, the second bank 324 has a bank specific local address storage 320 and address generator 322, and the third bank 334 has a bank specific local address storage 330 and address generator 332. Since the bank specific circuits may generally be similar to each other, only the first bank 314 and its circuits will be described in detail.

The match address HitXADD may be stored in one of the local address storage structures 310, 320, or 330 based on the match bank address HitBADD. For example, a bank decoder (not shown) may activate one of the address storage structures, and then the match row address HitXADD may be stored in the activated address storage structure. The addresses HitXADD and HitBADD may, in some embodiments, be provided along a dedicated bus. The dedicated bus may operate in a serial fashion, a parallel fashion, or combinations thereof. In some embodiments, the addresses HitXADD and HitBADD may be provided along the same address bus which carries row and bank addresses (e.g., XADD and BADD) as part of normal access operations. In such embodiments, the memory may include logic which manages the timing of when the addresses HitXADD and HitBADD are provided so as not to interfere with normal memory operations.

The local address storage 310 may store one or more addresses HitXADD which were associated with the value of HitBADD associated with the bank 314. In some embodiments, the local address storage 310 may store only a single address HitXADD. In some embodiments, the local address storage 310 may store multiple addresses HitXADD. In embodiments where the local address storage 310 stores multiple addresses, logic (e.g., FIFO) may be used to manage the queue.

When the bank logic (e.g., the RHR state control 236 of FIG. 2) determines that a targeted refresh operation should be performed, the address HitXADD stored in the local address storage 310 may be provided to the address generator 312. The address generator 312 may calculate one or more refresh addresses RXADD based on the provided HitXADD. For example, the refresh addresses RXADD may represent word lines which are physically adjacent to the word lines associated with HitXADD. Other relationships (e.g., +/−2, +/−3, etc.) may be used. A row decoder associated with the bank 314 may then refresh the word lines associated with the refresh address RXADD.

In some embodiments, the local storage 310 may be omitted, and the aggressor detector circuit 302 may provide the addresses HitXADD and HitBADD directly to the address generator.

In some embodiments, different components of the memory 300 may be located in different regions of the memory chip. As indicated by dotted line 309, some components may be located in a 'bank region' or bank logic section which is physically proximal to the associated bank. For example, the local storage 310 and address generator 312 may be located in a bank region which is physically close to the first bank 314, the local storage 320 and address generator 322 may be located physically close to the second bank 324, etc. In contrast, some components which are not bank specific, such as the aggressor detector 302, may be located in a central region or central logic region of the memory chip. For example, the aggressor detector 302 may be located relatively far away from any of the banks. In some embodiments, the aggressor detector 302 may be located near the command/address pads of the memory (e.g., near the C/A terminals of FIG. 1). Putting the aggressor detector 302 in a central region may be useful as the central region may be less crowded than the bank logic regions and the aggressor storage structure 304 may take up a relatively large amount of space.

In some embodiments, the use of a shared aggressor detector circuit 302 may reduce the total size of the address storage structure 304 compared to memory devices where there is not a shared aggressor detector circuit 302 (e.g., and each bank has its own aggressor detector circuit 302). For example, the shared address storage structure 304 may store N addresses, but a memory device with no shared storage may have storage structures which store A addresses in each of B banks, and the total number of stored addresses A*B may be greater than N (although in some embodiments N may be greater than A). This may be because the total number of stored addresses A may be based on a 'worst case scenario' for the bank, whereas the number N in a shared embodiment may be based on a worst case which accounts for the fact that all banks cannot have a worst case attack at the same time (e.g., due to the limitations of how accesses work in the memory).

Accordingly in a shared embodiment such as the one shown in FIG. 3, the 'worst case scenario' may be based on a maximum rate at which all of the banks (e.g., 314, 324, 334 etc.) of the memory can be attacked, rather than being based on a rate at which any one bank may be attacked. For example, the memory may have a maximum rate at which it can be accessed. Thus, if a single bank is being attacked at a relatively high rate that may preclude accesses to other banks of the memory. Hence, since slots of the address storage structure 304 can be dynamically allocated to different banks, the overall number of slots may be based on this maximum attack rate, since a maximum attack rate for a single bank may prevent a maximum attack rate from occurring in additional banks. Accordingly, in a shared embodiment the total number of address storage space may be less than the total number of address storage space in memory devices which do not use shared aggressor detection. This may reduce an amount of space used for address storage on the device.

Figure 4:
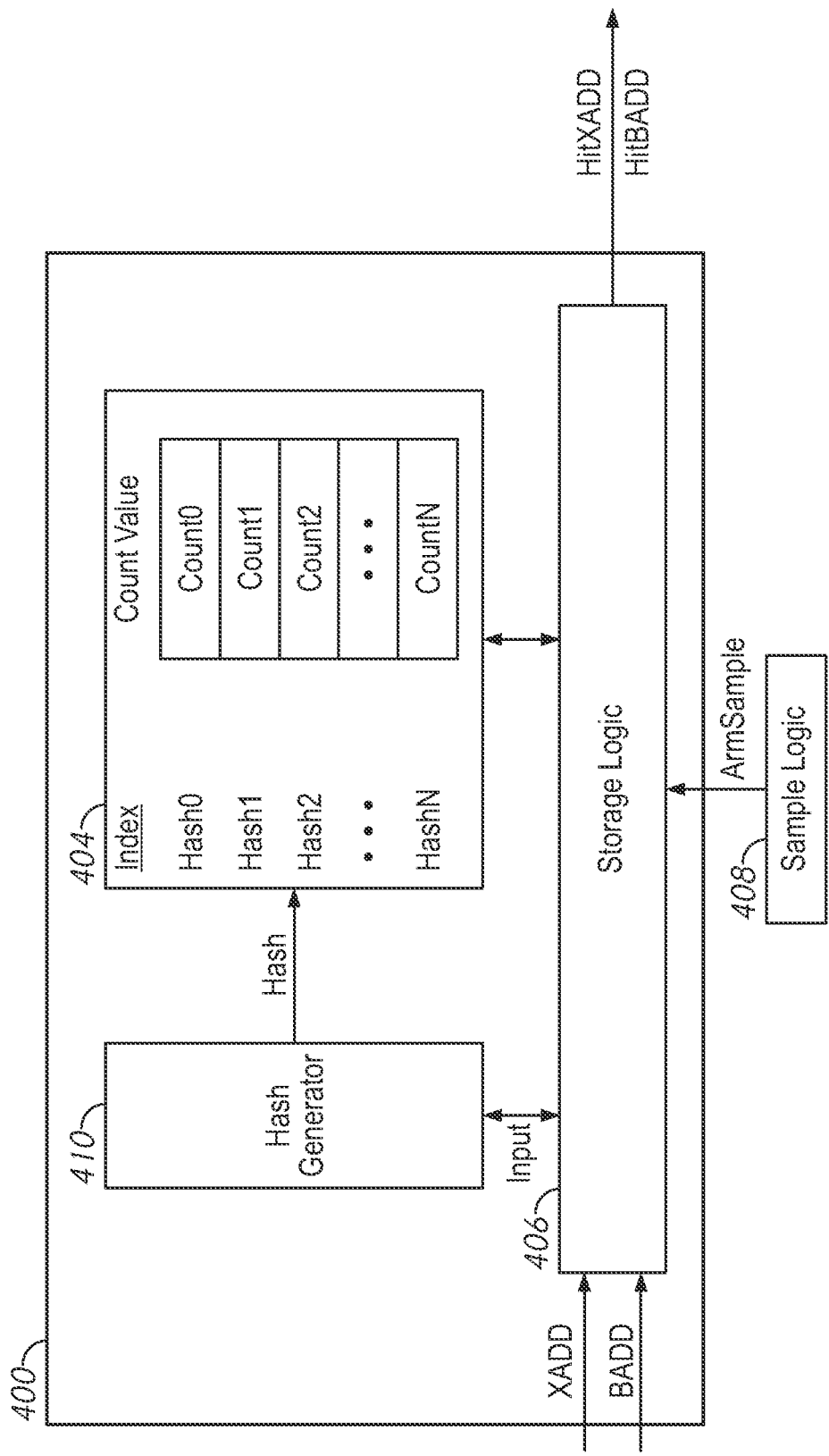
FIG. 4 is a block diagram of an aggressor detector according to some embodiments of the present disclosure.

FIG. 4 is a block diagram of an aggressor detector according to some embodiments of the present disclosure. The aggressor detector 400 of FIG. 4 may, in some embodiments, be included in the aggressor detector 232 of FIG. 2. Since the aggressor detector 400 may act in a manner generally analogous to the aggressor detector 232 of FIG. 2 and/or 302 of FIG. 3, for the sake of brevity features, operations, and components previously described with respect to those figures will not be described in detail again.

The aggressor detector 400 uses a hash circuit 410 to operate the aggressor storage structure 404. In the embodiment of FIG. 4, rather than directly storing the addresses XADD and BADD in the storage structure 404, the aggressor storage structure may use a hash generator 410 to generate a hash value, which may be used to index a count value in the storage structure 404. In this manner, a large number of possible values of received row and bank address XADD and BADD may be tracked by a smaller number of count values.

The hash generator 410 may receive a input value based on the row and bank address XADD and BADD, and may provide an index value Hash. The input value may include a first number of bits, and the index value Hash may include a second number of bits which is smaller than the first number. Accordingly, multiple values of Input may be associated with a value of the index value Hash. Each value of the index value Hash may be associated with a count value in the storage structure 404.

Based on the value of Hash, one of the counts in the storage structure 404 may be changed (e.g., incremented). The storage logic 406 may use the count values to determine if the received row and bank address XADD and BADD should be provided as the match address HitXADD and HitBADD. For example, the storage logic 406 may compare the changed count value to a threshold, and if the count value is greater than the threshold, the received row and bank address may be provided as the match address. The count value may then be changed (e.g., reset, decreased, etc.).

In some embodiments, the input value Input may include both the row and bank address XADD and BADD. For example, if the row address is 17 bits and the bank address is 5 bits, then the value Input may be 22 bits and may be concatenation of the row and bank address. In sonic embodiments, the input value Input may be the row address, and a second hash generator (not shown) may hash the bank address.

Figure 5:
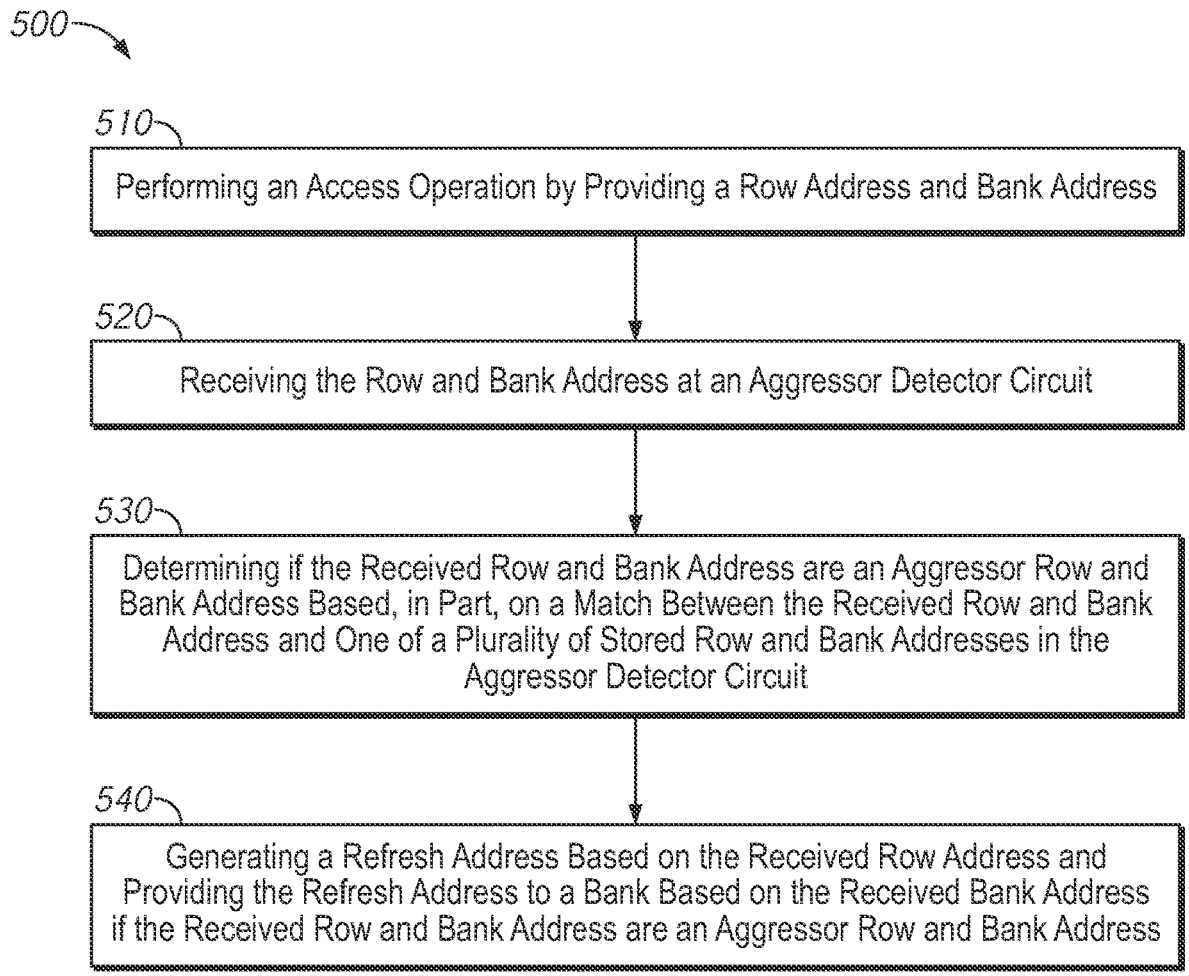
FIG. 5 is a block diagram of a method according to some embodiments of the present disclosure.

FIG. 5 is a block diagram of a method according to some embodiments of the present disclosure. The method 500 may, in some embodiments, be implemented by one or more of the components, apparatuses and/or systems described herein.

The method 500 may generally begin with block 510, which describes performing an access operation by providing a row address and bank address. The row and bank address may be provided along an address bus by an address decoder (e.g., 104 of FIG. 1). The row and bank address may be multi-bit signals, the value of which specifies a row and bank, respectively. For example, the bank address may specify one of a plurality of banks, while the row address may specify one of a plurality of rows (word lines) within that bank).

Block 510 may generally be followed by block 520, which describes receiving the row and bank address at an aggressor detector circuit. In some embodiments the row and bank address may be sampled, and may be received responsive to an activation of a sampling signal. The activations of the sampling signal may be performed with random timing, regular timing, semi-random timing, pseudo-random timing, timing based on one or more other signals, or combinations thereof. In some embodiments, the aggressor detector circuit may be located in a central region of a memory device (e.g., near the C/A terminals).

Block 520 may generally be followed by block 530, which describes determining if the received row and bank address are an aggressor row and bank address based, in part, on a match between the received row and bank address and one of a plurality of stored row and bank addresses in the aggressor detector circuit. A storage logic circuit may compare the received row and bank address to one or more stored row and bank addresses in an aggressor address storage structure. A match may be determined if the received row and bank address match the value of a stored row address and its associated stored bank address respectively. If there is not a match, in sonic embodiments, the storage logic circuit may store the received row and bank address in the aggressor address storage structure. In some embodiments, if there is a match, the received row and bank address may be determined to be an aggressor row and bank address. In some embodiments, the aggressor address storage structure may include count values associated with each stored row and bank address, and the count value may be changed (e.g., incremented) responsive to a match. The received row and bank address may be determined to be an aggressor row and bank address based on the count value (e.g., a comparison of the count value to a threshold).

Block 530 may generally be followed by block 540, which describes generating a refresh address based on the received row address and providing the refresh address to a bank based on the received bank address if the received row and bank address are an aggressor row and bank address. For example, the aggressor row and bank address may be provided to a selected set of bank specific circuits based on the aggressor bank address. The bank specific circuits may, in some embodiments, include a local storage structure which may hold the aggressor row address. The bank specific circuits may include a refresh address generator, which may generate the refresh address based on the aggressor row address as part of a targeted refresh operation. The refresh address may represent word lines which have a physical relationship (e.g., adjacency) to the word line represented by the aggressor row address. As part of the targeted refresh operation, the word line(s) associated with the refresh address may be refreshed.

As used herein, an activation of a sample may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a plurality of memory banks, each comprising a plurality of word lines; and
   an aggressor detector circuit configured to receive a bank address associated with one of the plurality of memory banks and a row address associated with one of the plurality of word lines in that bank and determine if the one of the plurality of word lines is an aggressor based on the row address and the bank address,
   wherein the aggressor detector circuit is configured to determine if the row address and the bank address are associated with the aggressor word line based on a comparison of the row address and the bank address to a stored row address and a stored bank address.

2. The apparatus of claim 1, wherein the aggressor detector circuit includes a storage structure configured to store a plurality of count values, wherein responsive to the row address and the bank address, a selected one of the plurality of count values is updated, and wherein the aggressor detector circuit is configured to determine if the one of the plurality of word line is the aggressor based on the selected one of the plurality of count values.

3. An apparatus comprising:
   a plurality of memory banks, each comprising a plurality of word lines; and
   an aggressor detector circuit configured to receive a bank address associated with one of the plurality of memory banks and a row address associated with one of the plurality of word lines in that bank and determine if the one of the plurality of word lines is an aggressor based on the row address and the bank address,
   wherein the aggressor detector circuit includes a storage structure configured to store a plurality of count values, wherein responsive to the row address and the bank address, a selected one of the plurality of count values is updated, and wherein the aggressor detector circuit is configured to determine if the one of the plurality of word line is the aggressor based on the selected one of the plurality of count values, and
   wherein the storage structure comprises a plurality of slots each associated with one of the plurality of count values, the plurality of slots configured to store a stored row address and a stored bank address, and wherein the selected one of the plurality of count values is selected based on a match between the row address and the bank address the stored row address and the stored bank address the associated one of the plurality of slots.

4. The apparatus of claim 1, further comprising a plurality of address generator circuits each associated with one of the plurality of memory banks, wherein the row address is provided to a selected one of the plurality of address generator circuits associated with the memory banks which includes the aggressor word line based on the row address.

5. The apparatus of claim 4, further comprising:
   a first address bus configured to provide the row address to the one of the plurality of memory banks as part of an access operation; and
   a second address bus configured to provide the row address to the selected one of the plurality of address generator circuits from the aggressor detector circuit.

6. The apparatus of claim 4, wherein the selected one of the plurality of address generators is configured to generate a refresh address based on the row address.

7. An apparatus comprising:
a first address generator associated with a first memory bank;
a second address generator associated with a second memory bank; and
an aggressor detector configured to receive a row address and a bank address, determine if the row and the bank address are associated with an aggressor word line, and provide the row address to one of the first address generator or the second address generator based on the bank address if the row address and the bank address are associated with the aggressor word line,
wherein the aggressor detector is configured to determine if the row address and the bank address are associated with the aggressor address based, in part, on a comparison of the row address and the bank address to a stored row address and a stored bank address.

8. The apparatus of claim 7, wherein the aggressor detector is configured to update a count value based on the row address and the bank address and determine if the row address and the bank address are associated with the aggressor address based on the count value.

9. The apparatus of claim 7, further comprising:
a first address bus configured to provide the row address to the first memory bank or the second memory bank as part of an access operation; and
a second address bus configured to couple the aggressor detector to the first address generator and the second address generator.

10. An apparatus comprising:
a first address generator associated with a first memory bank:
a second address generator associated with a second memory bank;
an aggressor detector configured to receive a row address and a bank address, determine if the row and the bank address are associated with an aggressor word line, and provide the row address to one of the first address generator or the second address generator based on the bank address if the row address and the bank address are associated with the aggressor word line;
a first local storage circuit associated with the first address generator; and
a second local storage circuit associated with the second address generator, wherein the row address is stored in the first local storage circuit or the second local storage circuit based on the bank address if the row and the bank address are associated with the aggressor word line.

11. The apparatus of claim 10, wherein the first address generator configured to generate a first refresh address based on an address stored first local storage circuit and second address generator configured to generate a second refresh address based on an address stored in the second storage local circuit.

12. An apparatus comprising:
a first address generator associated with a first memory bank;
a second address generator associated with a second memory bank;
an aggressor detector configured to receive a row address and a bank address, determine if the row and the bank address are associated with an aggressor word line, and provide the row address to one of the first address generator or the second address generator based on the bank address if the row address and the bank address are associated with the aggressor word line; and
command/address terminals configured to receive the row address and the bank address, wherein the first address generator is in an area closer to the first memory bank than to the command/address terminals, the second address generator is in an area closer to the second memory bank than to the command/address terminals, and the aggressor detector is in an area closer to the command/address terminals than to the first memory bank or the second memory bank.

13. A method comprising:
performing an access operation based on a row address and a bank address;
comparing the row address and the bank address to a plurality of stored row addresses and associated bank addresses;
determining that the row address and the bank address are an aggressor row address and an aggressor bank address based on the comparing; and
storing the row address and the bank address if they do not match any of the plurality of stored row addresses and the plurality of stored bank addresses.

14. The method of claim 13, further comprising:
providing the aggressor row address to an address generator associated with a bank based on the aggressor bank address; and
generating a refresh address from the aggressor row address with the address generator.

15. The method of claim 14, further comprising refreshing at least one word line in the bank based on the refresh address.

16. The method of claim 14, further comprising:
storing the aggressor row address in a local storage circuit associated with the bank; and
generating the refresh address based on the aggressor row address in the local storage.

17. The method of claim 13, further comprising:
providing the row address and the bank address to a bank along a first bus as part of the access operation; and
providing the aggressor row address an address generator associated with the bank along a second bus different than the first bus.

* * * * *